(12) United States Patent
Kwon et al.

(10) Patent No.: US 6,475,860 B2
(45) Date of Patent: Nov. 5, 2002

(54) METHOD FOR MANUFACTURING A FERROELECTRIC RANDOM ACCESS MEMORY DEVICE

(75) Inventors: O-Sung Kwon, Ichon-shi (KR); Chan-Ro Park, Ichon-shi (KR); Yeo-Song Seol, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/867,419

(22) Filed: May 31, 2001

(65) Prior Publication Data

US 2001/0048622 A1 Dec. 6, 2001

(30) Foreign Application Priority Data

May 31, 2000 (KR) ........................................ 2000-29642

(51) Int. Cl.⁷ .......................................... H01L 21/8242
(52) U.S. Cl. .......................................... 438/253; 438/3
(58) Field of Search ............................ 438/3, 239, 240, 438/250, 253, 393, 396, 643, 648, 649, 682, 683

(56) References Cited

U.S. PATENT DOCUMENTS

| | | | | |
|---|---|---|---|---|
| 5,576,564 A | * | 11/1996 | Satoh et al. | |
| 6,184,927 B1 | * | 2/2001 | Kang | |
| 6,190,924 B1 | * | 2/2001 | Lee | |
| 6,200,821 B1 | * | 3/2001 | Baek | |
| 6,297,161 B1 | * | 10/2001 | Sah | |

* cited by examiner

Primary Examiner—David Nelms
Assistant Examiner—Phuc T. Dang
(74) Attorney, Agent, or Firm—Pillsbury Winthrop LLP

(57) ABSTRACT

An improved method of manufacturing a capacitor structure for a ferroelectric random access memory (FeRAM) device on an active matrix having a first insulating layer comprising the steps of forming a buffer on the first insulating layer, a bottom electrode on the buffer, a capacitor thin film on the bottom electrode and a top electrode on the capacitor thin film. A second insulating layer is formed on the top electrode, the capacitor thin film and the first insulating layer, and then patterned and etched only once to form both a storage node contact hole and a cell plate contact hole. The capacitor structure is completed by forming a metal interconnection pattern on the second insulating layer and the contact holes to provide connection to the storage node and the cell plate.

17 Claims, 6 Drawing Sheets

METHOD FOR MANUFACTURING A FERROELECTRIC RANDOM ACCESS MEMORY DEVICE

FIELD OF THE INVENTION

However, in electronic commerce, there is the possibility that an accident or other problem could occur such that the purchased merchandise The present invention relates to a ferroelectric random access memory (FeRAM) device and, more particularly, to a method for manufacturing FeRAM devices utilizing a simplified method of manufacturing the ferroelectric capacitors incorporated therein.

DESCRIPTION OF THE PRIOR ART

With the improvement in film deposition techniques, research into applications of nonvolatile memory cells using ferroelectric thin films has been increasing. These nonvolatile memory cells utilize the high-speed polarization/inversion and the residual polarization of the ferroelectric capacitor thin films to produce a high-speed rewritable nonvolatile memory cell.

Therefore, ferroelectric random access memories (FeRAM) that incorporate a capacitor thin films having ferroelectric properties, such as strontium bismuth tantalate (SBT) and lead zirconate titanate (PZT), are becoming more common. The use of a ferroelectric material as the capacitor thin film in place of a conventional silicon oxide film or a silicon nitride film provides improved low-voltage and high-speed performance. Further, the residual polarization of the ferroelectric materials mean that FeRAM do not require a periodic refresh to prevent loss of information during standby intervals like a dynamic random access memory (DRAM). FeRAMs also provide this non-volatile performance without requiring the more complex structure of a conventional SRAM, thereby allowing increased densities.

Since ferroelectric materials have dielectric constants ranging from hundreds to thousands value and stabilized residual polarization properties at room temperature, they are being widely applied in non-volatile memory devices as the capacitor thin film. When a ferroelectric capacitor thin film is used in a non-volatile memory device, information data are stored in dipoles that have been polarized by applying an electric field. Even when electric field is removed, the dipoles retain their residual polarization so the stored information datum, i.e., a "0" or "1", can be retrieved.

Referring to FIGS. 1A to 1F, there are provided a series of cross-sectional views illustrating a conventional method for manufacturing an FeRAM device incorporating a ferroelectric capacitor.

The manufacturing steps begin with a preparation of an active matrix 110 upon which a number of predetermined manufacturing steps have been carried out. A first insulating layer 112 is then formed on the active matrix 110 and the surface is planarized using a chemical mechanical polishing (CMP) process. Thereafter, a buffer layer, a first conductive layer, a dielectric layer and a second conductive layer are sequentially formed on the first insulating layer.

The second conductive layer is patterned and etched to produce a first predetermined configuration, thereby forming a top electrode 120. Then, the dielectric layer, the first conductive layer and the buffer layer are patterned and etched to produce a second predetermined configuration, thereby forming a ferroelectric capacitor structure comprising a top electrode 120, a capacitor thin film 118, a bottom electrode 116 and a buffer 114, as shown in FIG. 1A.

In a next step, a photoresist layer is formed on the top electrode 120, the capacitor thin film 118 and the first insulating layer 112. This photoresist layer is then patterned to produce a photoresist pattern 122 having a first opening 130, as shown in FIG. 1B.

In an ensuing step, the capacitor thin film 118 is etched to produce a third predetermined configuration using the photoresist pattern 122 as a mask, whereby a portion of the bottom electrode 116 is exposed, as shown in FIG. 1C. Thereafter, the photoresist pattern 122 is removed and the wafer is cleaned using a rinse step to remove etch residues and other particulates.

In a subsequent step, a second insulating layer 124 is formed on the ferroelectric capacitor structure and the first insulating layer 112. A mask layer is then formed on the second insulating layer 124 and patterned to produce a fourth predetermined configuration and to obtain a mask pattern 125, a second opening 135 and the third opening 140, as shown in FIG. 1D.

Thereafter, the second insulating layer is etched using mask pattern 125, after which mask pattern 125 is removed, thereby forming a storage node contact hole 135A and a cell plate contact hole 140A, as shown in FIG. 1E.

Finally, a metal interconnection 126 pattern is formed over the storage node contact hole 135A and the cell plate node contact hole 140A, as shown in FIG. 1F.

According to the conventional method for manufacturing the ferroelectric capacitor, forming the metal interconnection pattern requires that a masking process and an etching process be repeated twice, resulting in a manufacturing process that is undesirably complicated. Further, in addition to the complexity, with the conventional method the cell plate contact hole is twice exposed to the plasma etch for extended periods, greatly increasing the risk of degrading the electrical properties of the bottom electrode.

SUMMARY OF THE INVENTION

It is, therefore, an object of the present invention to provide a ferroelectric random access memory (FeRAM) device in which the ferroelectric capacitor structure is produced using a simplified process that preserves the electrical properties of the cell plate contact.

It is another object of the present invention to provide a method for manufacturing the FeRAM device utilizing a simplified process for forming the ferroelectric capacitor structure.

In accordance with these objects, the present invention provides a method for manufacturing a ferroelectric random access memory (FeRAM) device, the method comprising the steps of: a) preparing an active matrix incorporating therein a substrate, a transistor, an isolation region and a first insulating layer; b) forming a ferroelectric capacitor structure, the capacitor structure comprising a buffer formed on the first insulating layer, a bottom electrode formed on the buffer, a capacitor thin film formed on the bottom electrode and a top electrode formed on the capacitor thin film; c) forming a second insulating layer on the top electrode, the capacitor thin film and the first insulating layer; d) forming a photoresist pattern having a first opening and a second opening; e) etching the second insulating layer into the predetermined configuration to open a storage node contact hole and a cell plate contact hole; and f) forming a metal interconnection over the second insulating layer and into the storage node contact hole and the cell plate contact hole.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 2A to 2E cross-sectional views setting forth a method for manufacturing a ferroelectric random access memory (FeRAM) device incorporating therein a ferroelectric capacitor in accordance with a preferred embodiment of the present invention.

Figure 1A:
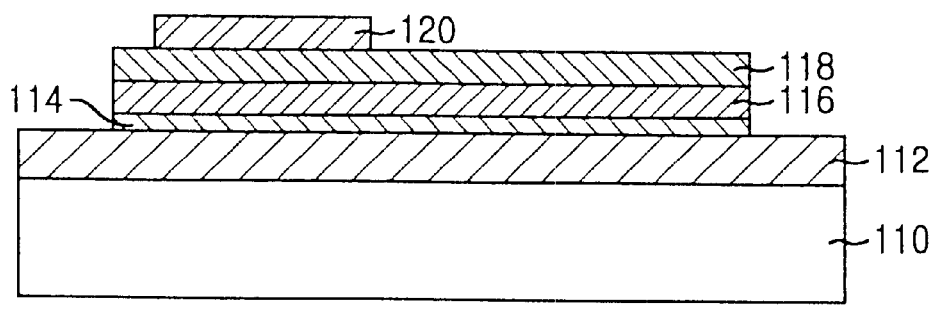
FIGS. 1A to 1F are cross sectional views setting forth a conventional method for manufacturing a ferroelectric random access memory (FeRAM) device.
Figure 1B:
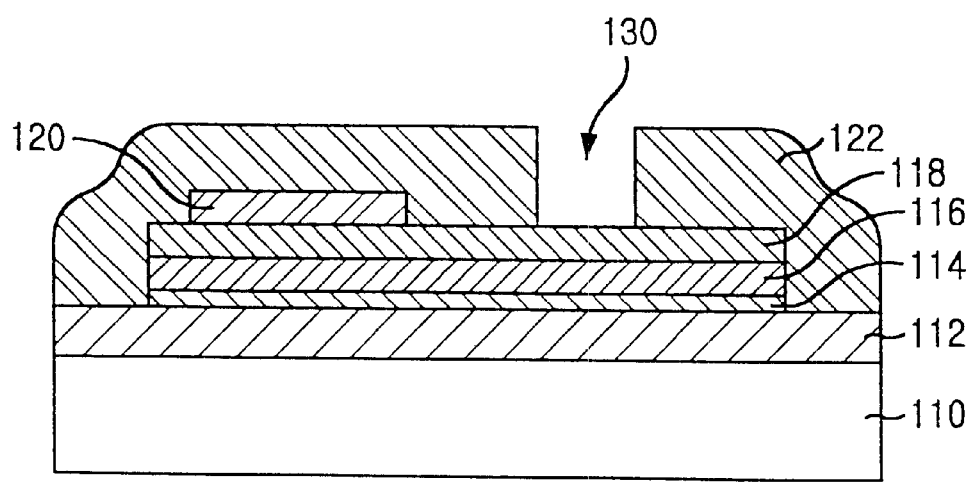
Figure 1C:
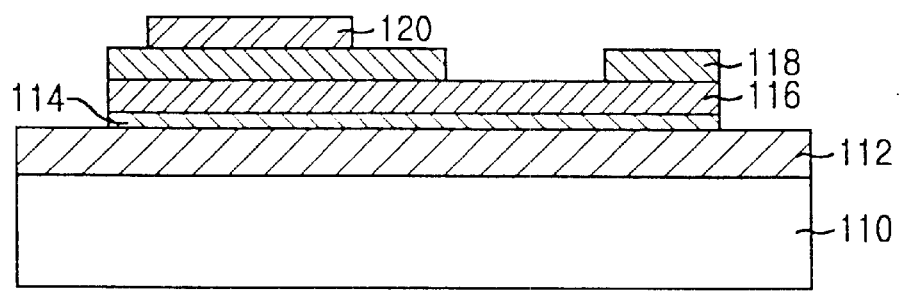
Figure 1D:
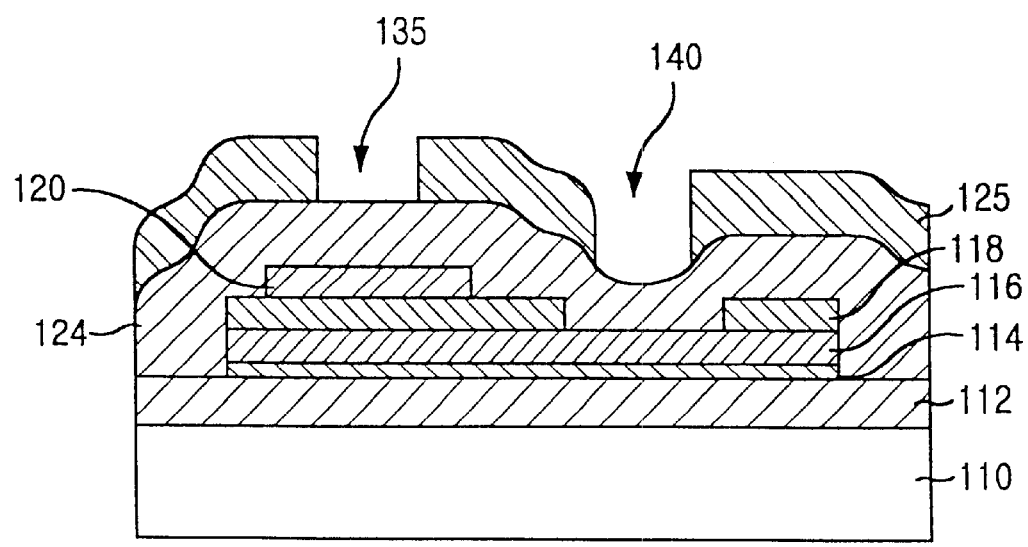
Figure 1E:
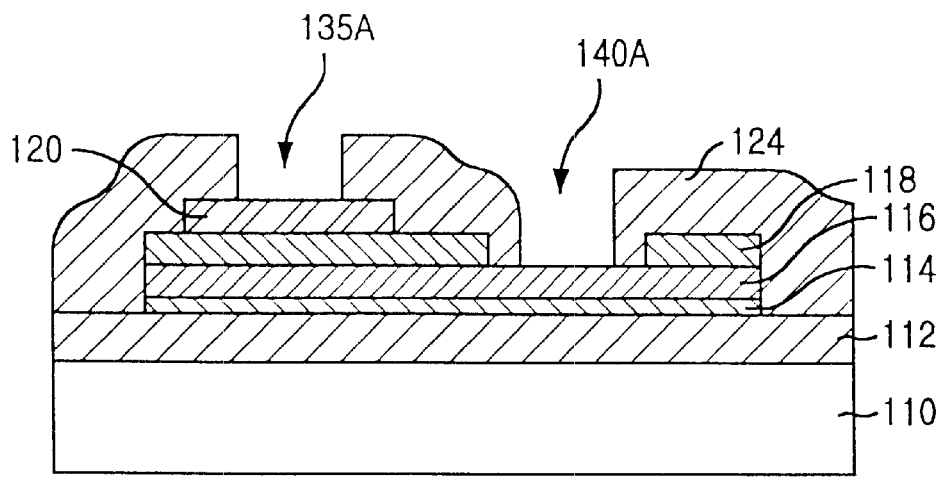
Figure 1F:
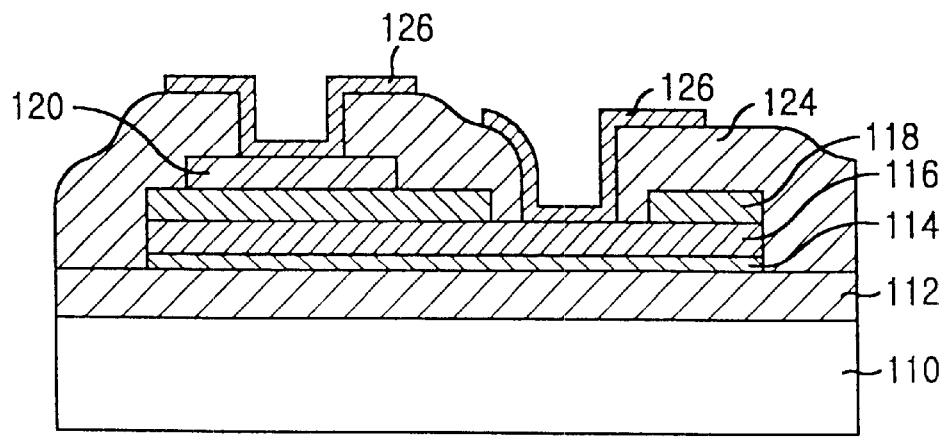
Figure 2A:
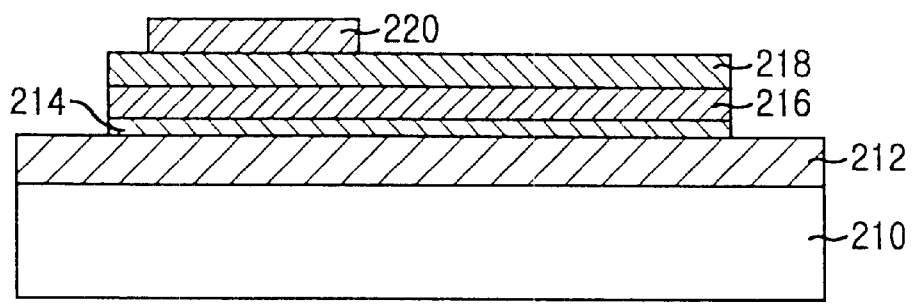
FIGS. 2A to 2E are cross sectional views setting forth a method for manufacturing a ferroelectric random access memory (FeRAM) device in accordance with a preferred embodiment of the present invention.

The manufacturing steps begin with a preparation of an active matrix 210 upon which a series of predetermined manufacturing steps have been completed. A first insulating layer 212 is then formed on the active matrix 210 after which the surface is planarized using a chemical mechanical polishing (CMP) process. Thereafter, a buffer layer, a first conductive layer, a dielectric layer and a second conductive layer are sequentially formed on the first insulating layer. The second conductive layer is then patterned with a first predetermined configuration and etched to form a top electrode 220. Then, the dielectric layer, the first conductive layer and the buffer layer are patterned with a second predetermined configuration and etched to form a ferroelectric capacitor having a top electrode 220, a capacitor thin film 218, a bottom electrode 216 and a buffer 214, as shown in FIG. 2A. The buffer layer preferably comprises a layer of $TiO_2$, $Al_2O_3$, Ti, TiN, AlN or BN with the capacitor thin film 218 preferably comprising a ferroelectric material such as SBT or PZT. Subsequently, a first recovery process is performed to recover the ferroelectric characteristics of the capacitor thin film 218. A suitable result can be obtained at a temperature of approximately 600–900° C. and at pressure of approximately 1 to 760 mTorr for approximately 5–20 minutes under an oxygen ($O_2$) gas atmosphere. The partial pressure of the oxygen gas is 50 to 100%. The furnace is purged with $O_2$ or backfilled with $O_2$.

Figure 2B:
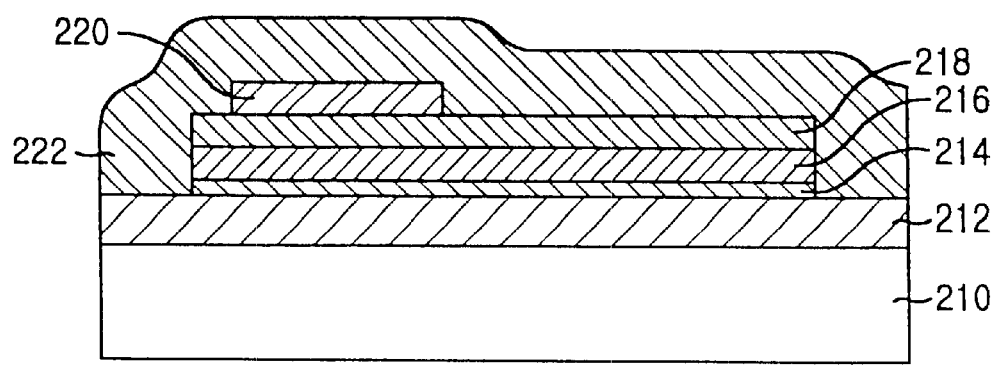

A second insulating layer 222 is then formed on the top electrode 220, the capacitor thin film 218 and the first insulating layer 212, as shown in FIG. 2B.

Figure 2C:
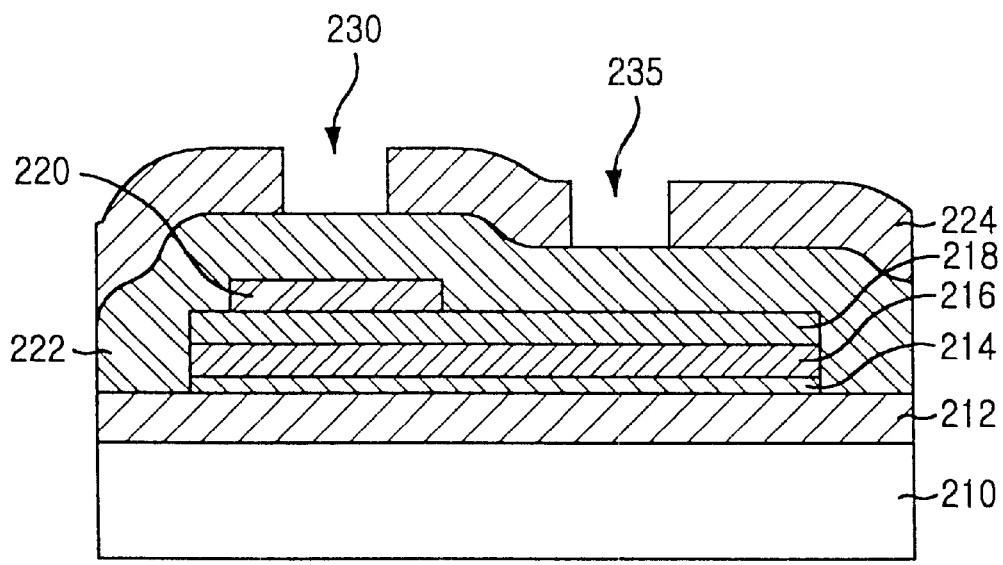

A photoresist layer is then formed on the second insulating layer 222 and patterned with a third predetermined configuration to obtain photoresist pattern 224, a first opening 230 and a second opening 235, as shown in FIG. 2C.

Figure 2D:
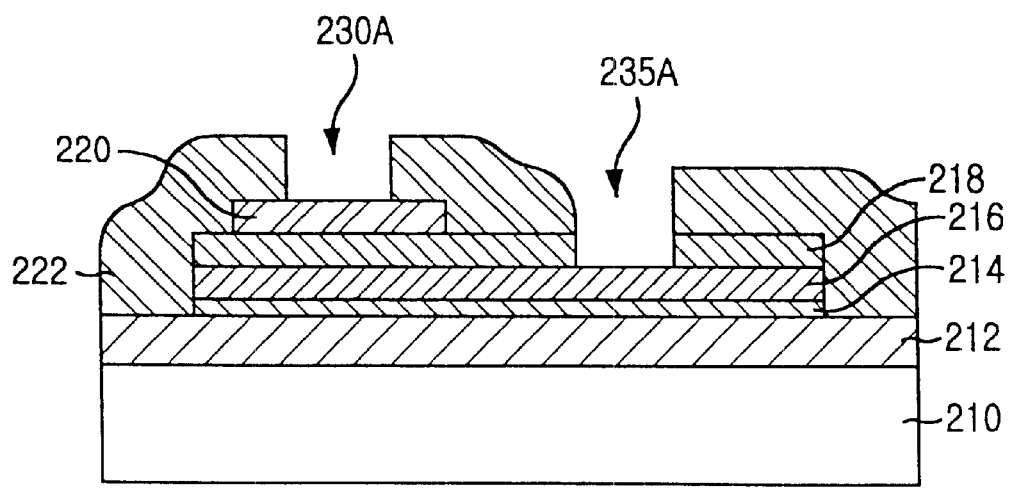

Thereafter, the second insulating layer 222 is etched with a dry etch process using photoresist pattern 224 as an etch mask to open a node contact hole 230A and a cell plate node contact hole 235A in the second insulating layer 222, as shown in FIG. 2D. The dry etching process is preferably carried out in at least two discrete steps. The first etching step is used primarily to etch only the second insulating layer 222 while the second etching step is then used to etch the exposed portion of the capacitor thin film 218. Therefore, the second etching step, i.e., an over-etching step, should be performed using an etch chemistry and etch conditions sufficient to protect the top electrode while the cell plate node contact hole is opened in the capacitor thin film.

In particular, it has been found that satisfactory results may be obtained when the first etching step is performed with plasma etchers adopting dual power, a source power and a bias power, such as planar reactive ion ether, inductively coupled plasma etcher, transformer coupled plasma etcher and helicon plasma etcher, in the condition of the source power at 600–1800 W, the bias power at 1500–2500 W, an argon gas (Ar) flow of 100–200 sccm (standard cubic centimeters per minute), a $CF_4$ flow 15–35 sccm, an $O_2$ flow of 2–30 sccm and a $N_2$ flow of 5–50 sccm at a pressure of 18–30 mTorr.

The second etching step, however, is preferably performed with the same source power and bias power settings used in the first etch, but with the gas flows adjusted to provide an argon gas (Ar) flow of 80–200 sccm, a $CF_4$ flow of 10–35 sccm, an $O_2$ flow of 5 sccm 2–20 sccm and a $N_2$ flow of 5–50 sccm at a pressure of 15–45 mTorr.

The second set of etch parameters results in a first etch rate into the top electrode and a second etch rate into the dielectric layer. The second etch rate is at least five times greater than the first etch rate.

Referring back to FIG. 2D, after the two-step dry etching process described above has been completed, the photoresist pattern 224 is removed and residues produced the etching steps are removed by a rinse step. Thereafter, a second recovery is conducted to recover the ferroelectric characteristics, again preferably at approximately 600–900° C. for 5–200 minutes in an oxygen gas ambient.

The first recovery and the second recovery are respectively performed at oxygen-enriched atmospheres comprising more than 50% oxygen.

Figure 2E:
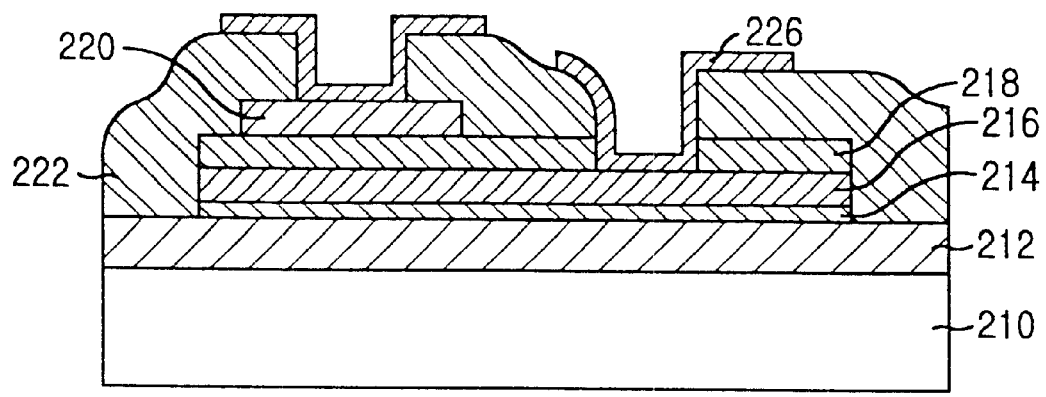

Finally, a metal interconnection pattern 226 is formed over the storage node contact hole 230A and the cell plate node contact hole 235A, as shown in FIG. 2E.

In comparison with the prior art methods, the present method requires only a single masking and etching process, thereby reducing the number of manufacturing steps necessary to form the ferroelectric capacitor structure. Furthermore, by limiting the exposure of the cell plate contact hole to the plasma etch environment, the present method enhances the resulting ferroelectric characteristics.

While the present invention has been described with respect to a preferred embodiment, it will be apparent to those skilled in the art that various changes and modifications may be made to the basic method without departing from the scope of the invention as defined in the following claims.

What is claimed is:

1. A method for manufacturing a ferroelectric random access memory (FeRAM) device, the method comprising the steps of:

a) preparing a substrate on which a first insulating layer is formed;

b) forming a ferroelectric capacitor structure comprising a buffer formed on the first insulating layer, a bottom electrode formed on the buffer, a capacitor thin film formed on the bottom electrode, and a top electrode formed on the capacitor thin film;

c) forming a second insulating layer on the top electrode, the capacitor thin film and the first insulating layer;

d) forming a photoresist pattern on the second insulating layer that exposes a first portion of the second insulating layer above the top electrode and exposes a second portion of the second insulating layer above the bottom electrode;

e) etching the first portion of the second insulating layer with a first set of etch parameters to expose a portion of the top electrode, thereby forming a storage node contact hole and etching the second portion of the second insulating layer to expose a portion of the capacitor thin film;

f) etching the exposed portion of the capacitor thin film with a second set of etch parameters to form a cell plate contact hole, wherein the second set of etch parameters is different from the first set of etch parameters; and g) forming a metal interconnection pattern over the second insulating layer and into the storage node contact hole and the cell plate contact hole.

2. The method as recited in claim 1, wherein the first set of etch parameters comprise:

a source power of 600–1800 W;
a bias power of 1500–2500 W;
an Ar flow of 100–200 sccm;
a $CF_4$ flow of 15–35 sccm;
an $O_2$ flow of 2–30 sccm;
a $N_2$ flow of 5–50 sccm; and
a pressure of 18–30 mTorr.

3. The method as recited in claim 2, wherein the second set of etch parameters comprise:

a source power of 600–1800 W;
a bias power of 1500–2500 W;
an Ar flow of 80–200 sccm;
a $CF_4$ flow of 10–35 sccm;
an $O_2$ flow of 2–20 sccm;
a $N_2$ flow of 5–50 sccm; and
a pressure of 15–45 mTorr.

4. The method as recited in claim 1, wherein the buffer comprises $TiO_2$, $Al_2O_3$, Ti, TiN, AlN or BN.

5. The method as recited in claim 1, wherein the capacitor thin film comprises a ferroelectric material selected from the group consisting of strontium bismuth tantalate (SBT), lead zirconate titanate (PZT).

6. The method as recited in claim 1, wherein after the step b), further comprising a step of carrying out a first recovery at approximately 600–900° C. for 5–200 minutes in a first oxygen-enriched atmosphere.

7. The method as recited in claim 1, after the step f), further comprising a step of carrying out. a recovery at approximately 600–900° C. for 5–200 minutes in a first oxygen-enriched atmosphere.

8. The method as recited in claim 6, after the step f), further comprising a step of carrying out a second recovery at approximately 600–900° C. for 5–200 minutes in a second oxygen-enriched atmosphere.

9. The method as recited in claim 8, wherein the first oxygen-enriched atmosphere comprises more than 50% oxygen and further wherein the second oxygen-enriched atmosphere comprises more than 50% oxygen.

10. The method as recited in claim 1, wherein the second set of etch parameters results in a first etch rate into the top electrode and a second etch rate into the dielectric layer, wherein the second etch rate is at least five times greater than the first etch rate.

11. A method for manufacturing a ferroelectric random access memory (FeRAM) device, the method comprising, in order, the steps of:

a) preparing a substrate on which a first insulating layer is formed;

b) forming a buffer layer on the first insulating layer;

c) forming a bottom electrode layer on the buffer layer;

d) forming a ferroelectric dielectric layer on the bottom electrode layer;

e) forming a top electrode layer on the ferroelectric dielectric layer;

f) forming a top electrode photoresist pattern;

g) etching the top electrode layer using the top electrode photoresist pattern as an etch mask to form a top electrode and to expose a surface of the ferroelectric dielectric layer adjacent the top electrode;

h) removing the top electrode photoresist pattern;

i) forming a capacitor photoresist pattern, the capacitor photoresist pattern covering both the top electrode and a portion of the exposed surface of the ferroelectric dielectric layer adjacent the top electrode;

j) etching the ferroelectric dielectric layer, the bottom electrode layer and the buffer layer using the capacitor photoresist pattern as an etch mask to form a capacitor structure comprising a top electrode, a ferroelectric dielectric, a bottom electrode, and a buffer, and to expose a surface of the first insulating layer adjacent the capacitor structure;

k) removing the capacitor photoresist pattern;

l) forming a second insulating layer, the second insulating layer covering the top electrode, the exposed surface of the ferroelectric dielectric and the exposed surface of the first insulating layer;

m) forming a contact photoresist pattern on the second insulating layer, the contact photoresist pattern comprising a storage node contact opening and a cell plate contact opening, the storage node opening being positioned above a portion of the top electrode and the cell plate contact opening being positioned above a portion of the ferroelectric dielectric adjacent the top electrode;

n) etching the second insulating layer using a first set of etch parameters to expose a portion of the top electrode below the storage node contact opening and to expose a portion of the ferroelectric dielectric below the cell plate contact opening;

o) etching the exposed portion of the ferroelectric dielectric using a second set of etch parameters, the second set of etch parameters being unequal to the first set of etch parameters to expose a portion of the bottom electrode below the cell plate contact opening;

p) removing the contact photoresist pattern;

q) depositing a conductive layer on the second insulating layer, the exposed portion of the top electrode and the exposed portion of the bottom electrode;

r) forming an interconnection photoresist pattern on the conductive layer;

s) etching the conductive layer using the interconnection photoresist pattern as an etch mask to form an interconnection pattern; and t) removing the interconnection photoresist pattern.

12. A method according to claim 11, further comprising a step of heating the capacitor structure to a temperature of about 700° C. for about 30 minutes under an oxygen-enriched atmosphere, this heating step being performed between steps k) and l).

13. A method according to claim 12, further comprising a second step of heating the capacitor structure to a temperature of about 600–900° C. for 5–200 minutes under an oxygen-enriched atmosphere, this second heating step being performed between steps p) and q).

14. The method as recited in claim 12, wherein the first set of etch parameters comprise:

a source power of 600–1800 W; a bias power of 1500–2500 W; an Ar flow of 100–200 sccm; a $CF_4$ flow of 15–35 sccm;

an $O_2$ flow of 2–30 sccm;
a $N_2$ flow of 5–50 sccm; and
a pressure of 18–30 mTorr.

15. The method as recited in claim 14, wherein the second set of etch parameters comprise:
a source power of 600–1800 W;
a bias power of 1500–2500 W;
an Ar flow of 80–200 sccm;
a $CF_4$ flow of 10–35 sccm;
an $O_2$ flow of 2–20 sccm;
a $N_2$ flow of 5–50 sccm; and
a pressure of 15–45 mTorr.

16. The method as recited in claim 12, wherein the buffer layer comprises $TiO_2$, $Al_2O_3$, Ti, TiN, AlN or BN titanium oxide.

17. The method as recited in claim 12, wherein the ferroelectric dielectric layer comprises a ferroelectric material selected from the group consisting of strontium bismuth tantalate (SBT), lead zirconate titanate (PZT).

* * * * *